United States Patent
Chung et al.

(10) Patent No.: US 10,074,411 B2
(45) Date of Patent: Sep. 11, 2018

(54) MODE-CHANGEABLE DUAL DATA RATE RANDOM ACCESS MEMORY DRIVER WITH ASYMMETRIC OFFSET AND MEMORY INTERFACE INCORPORATING THE SAME

(71) Applicant: Nvidia Corporation, Santa Clara, CA (US)

(72) Inventors: Daehyun Chung, Santa Clara, CA (US); Sunil Sudhakaran, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 658 days.

(21) Appl. No.: 14/164,005

(22) Filed: Jan. 24, 2014

(65) Prior Publication Data

US 2015/0213855 A1   Jul. 30, 2015

(51) Int. Cl.
    *G11C 7/22*      (2006.01)
    *G11C 11/4076*   (2006.01)
    *G11C 7/10*      (2006.01)

(52) U.S. Cl.
    CPC ........ *G11C 7/22* (2013.01); *G11C 7/109* (2013.01); *G11C 7/1087* (2013.01); *G11C 7/1093* (2013.01); *G11C 11/4076* (2013.01)

(58) Field of Classification Search
    CPC ......... G11C 7/22; G11C 7/10; G11C 11/4076; G11C 8/18; G11C 7/1045; G11C 7/1015
    USPC .................................. 365/233.13, 233.1, 194
    See application file for complete search history.

(56) References Cited

U.S. PATENT DOCUMENTS

| | | | | |
|---|---|---|---|---|
| 6,125,078 A | * | 9/2000 | Ooishi ................. | G11C 7/1045 365/230.03 |
| 7,317,333 B1 | * | 1/2008 | Zhou et al. ..................... | 326/80 |
| 8,665,664 B2 | * | 3/2014 | Moon .................. | G11C 7/1051 365/233.11 |
| 2003/0189446 A1 | * | 10/2003 | Yoo et al. ...................... | 327/108 |
| 2011/0205818 A1 | * | 8/2011 | Moon .................. | G11C 7/1051 365/194 |
| 2012/0187978 A1 | * | 7/2012 | Fazeel et al. .................... | 326/30 |
| 2014/0016404 A1 | * | 1/2014 | Kim et al. ..................... | 365/158 |

OTHER PUBLICATIONS

Cooperman, Gene, "DDR RAM", http://www.ccs.neu.edu/course/com3200/parent/NOTES/DDR.html, 7 pages.

(Continued)

*Primary Examiner* — Richard Elms
*Assistant Examiner* — Jerome Leboeuf
(74) *Attorney, Agent, or Firm* — Richard Calderwood; Parker Justiss, P.C.

(57) ABSTRACT

A memory driver, a method of driving a command bus for a synchronous dual data rate (sDDR) memory and a memory controller for controlling dynamic random-access memory (DRAM). In one embodiment, the memory driver includes: (1) pull-up and pull-down transistors couplable to a command bus of a memory controller and operable in 1N and 2N timing modes and (2) gear down offset circuitry coupled to the pull-up transistor and operable to offset the command bus when transitioning out of the 1N timing mode and increase an extent and duration of 1-0-1 transitions on the command bus.

20 Claims, 11 Drawing Sheets

(56) References Cited

OTHER PUBLICATIONS

Semiconductor, Freescale, and Motorola AppNote AN2582. "Hardware and Layout Design Considerations for DDR Memory Interfaces." (2003).
"General DDR SDRAM Functionality", TN4605.p. 65—Rev.A; Pub. 7/01, Micron Technology, Inc., 2001, 11 pages.

* cited by examiner

MODE-CHANGEABLE DUAL DATA RATE RANDOM ACCESS MEMORY DRIVER WITH ASYMMETRIC OFFSET AND MEMORY INTERFACE INCORPORATING THE SAME

TECHNICAL FIELD

This application is directed, in general, to random-access memory (RAM) controllers and, more specifically, to a driver for dual data rate (DDR) dynamic random-access memory (DRAM).

BACKGROUND

Recent DDR-based system memory interface per-pin speeds are approaching 1.6 GHz (3.2 Gbps) with sDDR4. One bottleneck limiting this frequency target is command timing, since it employs a single driver to perform multiple loads. FIG. 1 illustrates this issue. As FIG. 1 shows, a single driver 110 is tasked with driving signals to four separate loads 120a, 120b, 120c, 120d. The driver 110 experiences timing margin losses by virtue of numerous reflections from the four loads.

To achieve the required speed target, sDDR4 introduces a half-rate, 2N timing mode (also called a gear-down mode) that may be employed for the command interface (hence making the full rate a 1N timing mode). FIG. 2 depicts control signals for both the 1N and 2N timing modes. The 2N mode appears to alleviate the bottleneck limiting the sDDR4 frequency target.

SUMMARY

One aspect provides a memory driver. In one embodiment, the memory driver includes: (1) pull-up and pull-down transistors couplable to a command bus of a memory controller and operable in 1N and 2N timing modes and (2) gear down offset circuitry coupled to the pull-up transistor and operable to offset the command bus when transitioning out of the 1N timing mode and increase an extent and duration of 1-0-1 transitions on the command bus.

Another aspect provides a method of driving a command bus for sDDR memory. In one embodiment, the method includes: (1) asserting and deasserting command signals to pull-up and pull-down transistors coupled to the command bus during both 1N and 2N timing modes, the command bus being pulled to a logic one or a logic zero, (2) asserting a Gear down signal to offset the command bus when transitioning out of the 1N timing mode and into the 2N timing mode and (3) deasserting the Gear down signal following the transitioning.

Yet another aspect provides a memory controller for controlling DRAM in 1N and 2N timing modes. In one embodiment, the memory controller includes: (1) a command core, (2) a command transmitter logic path coupled to the command core and (3) a command driver, having: (3a) pull-up and pull-down transistors couplable to a command bus of a memory controller and operable in the 1N and 2N timing modes, (3b) a terminating resistor coupled to the command bus and operable to provide a single-ended termination to a ground rail for the command bus and (3c) a further pull-up transistor coupled to the pull-up transistor and (4) a NAND gate operable to receive a Gear down signal and having an output coupled to drive the further pull-up transistor synchronously with the pull-up transistor.

BRIEF DESCRIPTION

Reference is now made to the following descriptions taken in conjunction with the accompanying drawings, in which.

Figure 7:
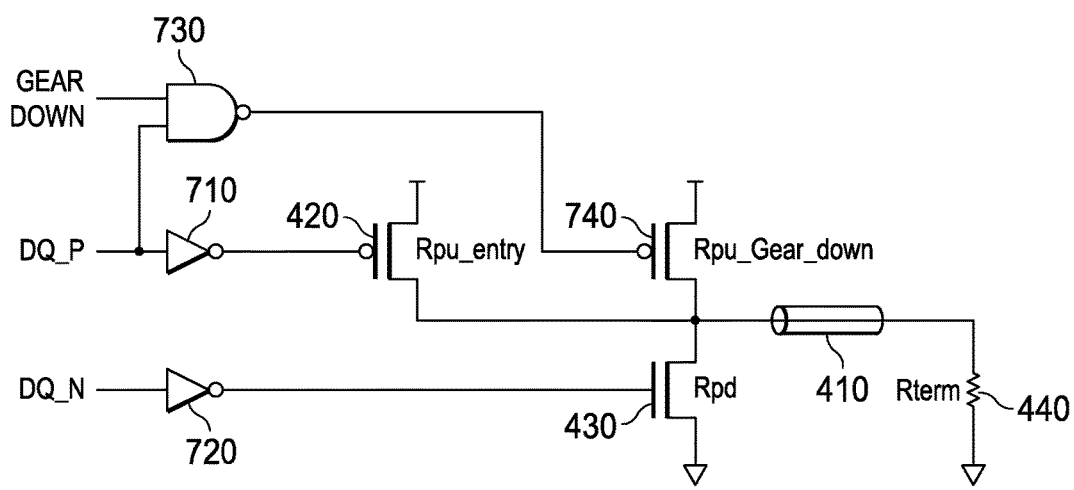
Figure 8A:
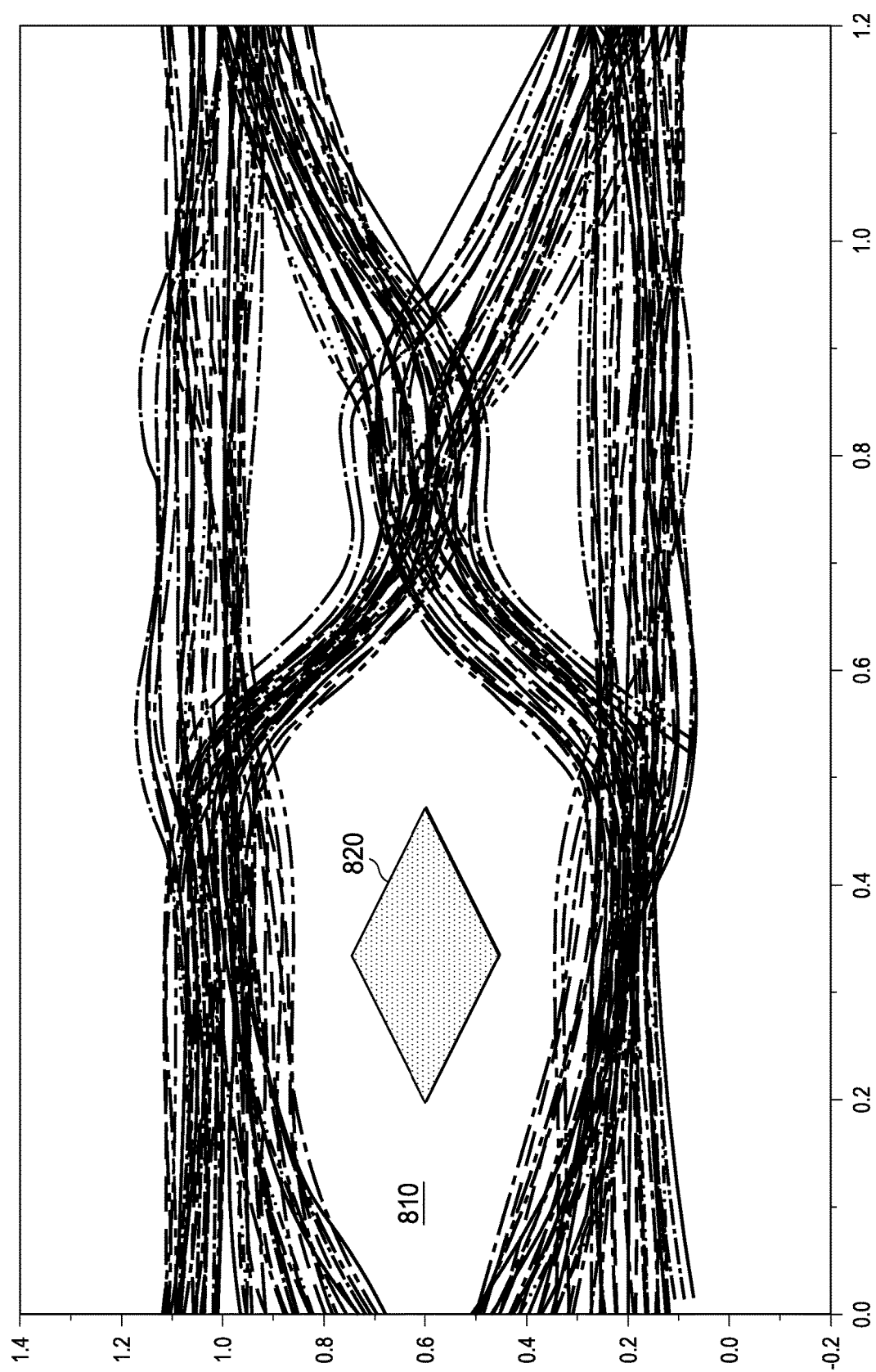
Figure 8B:
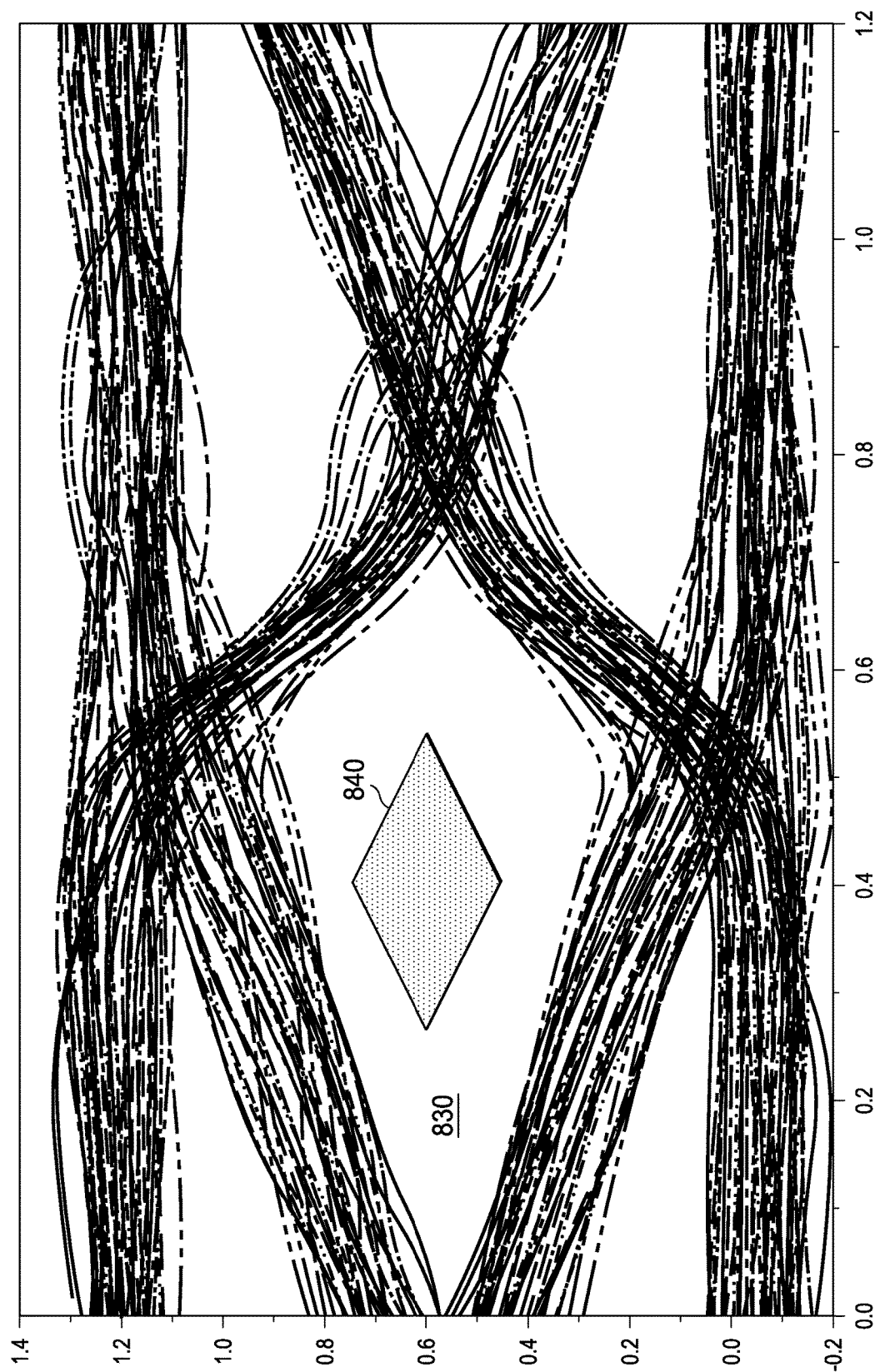
Figure 9:
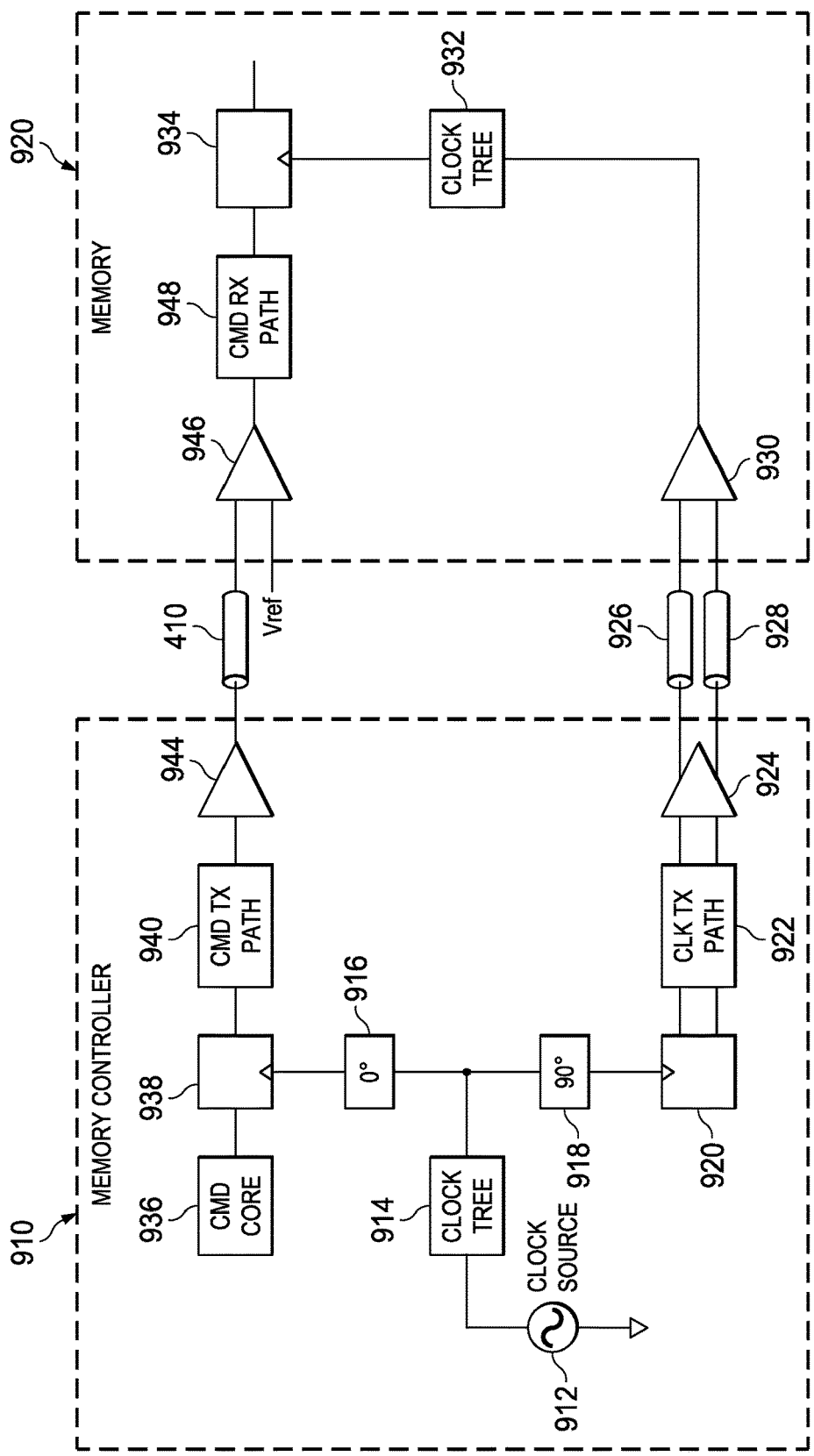
Figure 10:
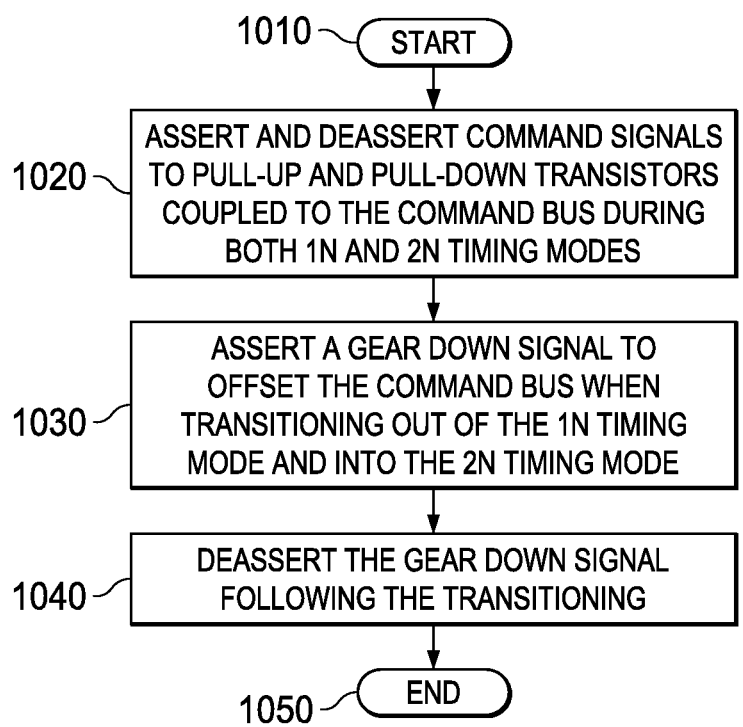

FIGS. 6A-6D graphically illustrate low transitions and concomitant ringing for four example combinations of drive and terminating resistances;

FIG. 7 is a high-level schematic of another embodiment of a DDR RAM driver;

FIGS. 8A and 8B graphically illustrate margins and data eyes for a command bus driven by a conventional driver and a driver constructed according to the teachings herein;

FIG. 9 is a block diagram of one embodiment of a memory controller constructed according to the teachings herein, together with a receiver portion of DDR RAM; and FIG. 10 is a flow diagram of one embodiment of a method of transitioning from the 1N timing mode to the 2N timing mode carried out according to the teachings herein.

DETAILED DESCRIPTION

As stated above, the 2N mode appears to alleviate the bottleneck limiting the sDDR4 frequency target. However, it is realized herein that an instananeous transition from the 1N timing mode to the 2N timing mode, while trivial to implement, is unsafe.

Figure 1:
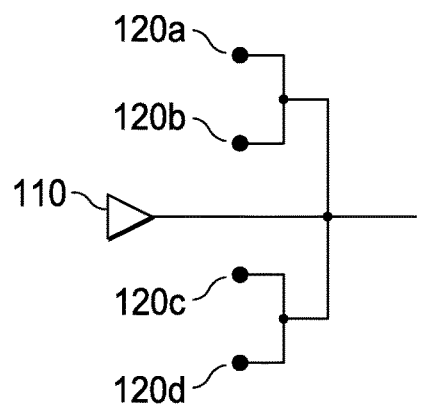
FIG. 1 is a high-level schematic depicting the command routing topology in sDDR4.
Figure 2:
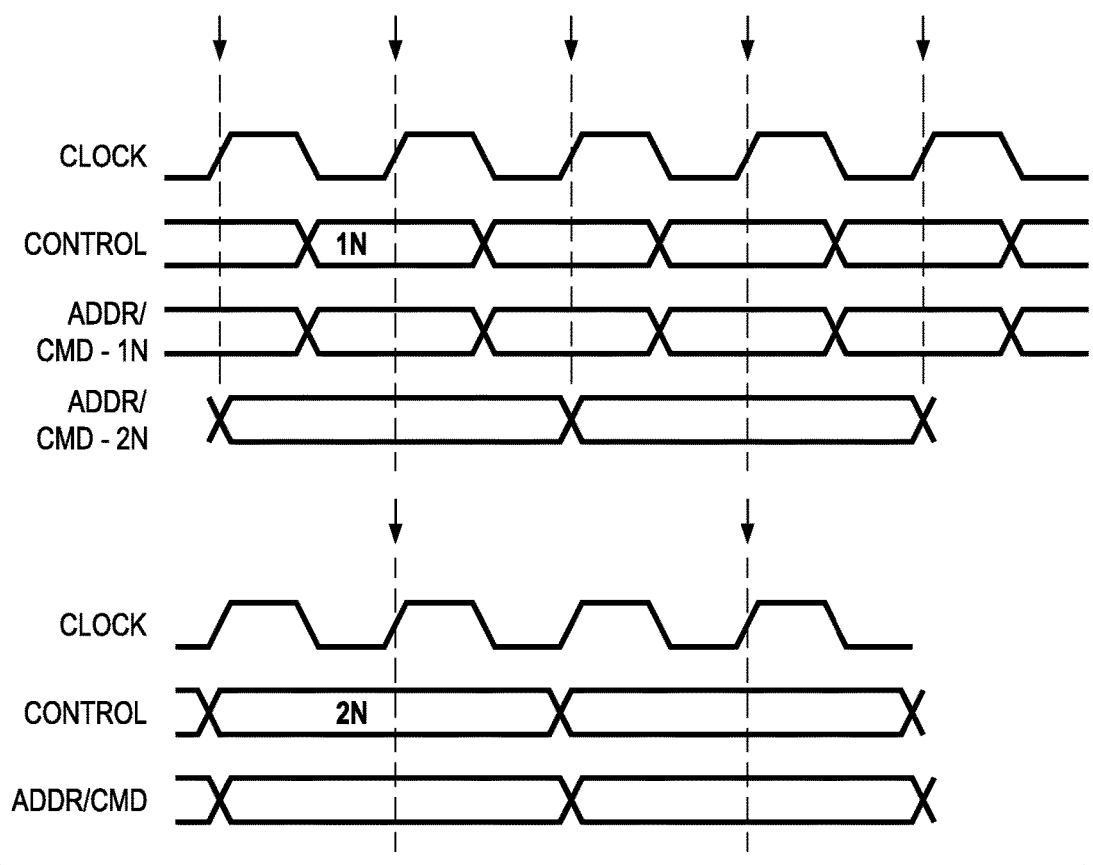
FIG. 2 is a timing diagram illustrating clock and control signals for both the 1N and 2N timing modes in sDDR4.
Figure 3:
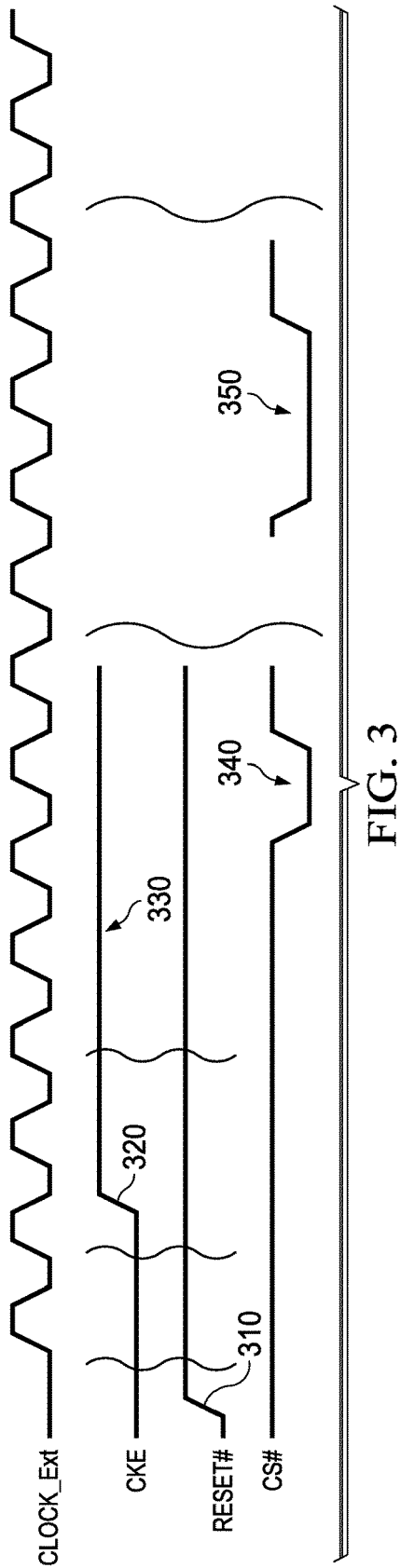
FIG. 3 is a timing diagram showing the transition from the 1N timing mode to the 2N timing mode (gear down mode entry timing)

It is more specifically realized herein that a one-time column select (CS#) synch pulse occurs just before the gear-down mode is entered, and that the memory needs to acquire this CS# synch pulse reliably while still in the 1N timing mode. It is further realized that, because the timing margins are so narrow, the acquisition of this one-time CS# synch pulse could define the frequency limit of the memory system as a whole. FIG. 3 helps to understand these realizations. Four signals are shown in FIG. 3: CLOCK_Ext, CKE, Reset# and CS#. In transitioning from the 1N timing mode to the 2N timing (gear-down) mode, Reset# goes active at a point 310, and the memory controller defaults to the 2N timing mode. A synch circuit is activated at this time. CKE then goes active, and a rank of memory is selected at a point 320, and CKE goes into a quiet time 330. The synch circuit initiates the synch pulse in CS# at a point 340, whereupon another quiet time occurs. Finally, the 2N timing mode begins, evidenced by an extended signal on CS# at a point 350.

It is realized that additional margin should be provided in the bus on which the CS# synch signal is conveyed so the CS# synch pulse can be acquired safely. It is further realized that, while ringing on the CS# bus should be damped to increase operating margins, conventional, double-ended bus termination is unnecessary. More specifically, since the CS# synch pulse is a 1-0-1 transition, termination of the CS# bus need only be single-ended such that damping need only occur after 1-0-1 transitions. It is still further realized that judicious component selection in the driver can create an asymmetric DC offset in the CS# bus that adds operating margin.

Accordingly, introduced herein are various embodiments of a DDR RAM driver having an asymmetric offset, a method of driving a DDR RAM CS# bus and a memory controller incorporating the driver or the method. In general, the embodiments provide single-ended termination and accommodate transitions from the 1N timing mode to the 2N timing mode while preserving the CS# synch signal for accurate reception by DDR RAM memory.

Figure 4:
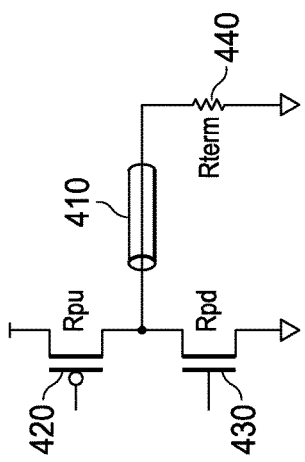
FIG. 4 is a high-level schematic of one embodiment of a portion of a DDR RAM driver.

FIG. 4 is a high-level schematic of one embodiment of a portion of a DDR RAM driver. The driver drives a command bus 410. The driver includes a pull-up transistor 420 having a pull-up resistance Rpu associated therewith and a pull-down transistor 430 having a pull-down resistance Rpd associated therewith. The pull-up transistor 420 and the pull-down transistor 430 are coupled in series between supply and ground rails (e.g., Vddq and GND). The pull-up transistor 420 is illustrated as being a p-channel metal oxide semiconductor field-effect transistor (MOSFET), and the pull-down transistor 430 is illustrated as being an n-channel MOSFET. The command bus 410 is coupled to a node between the pull-up transistor 420 and the pull-down transistor 430. A termination resistor 440 having a resistance Rterm is coupled between a distal end of the command bus 410 and the ground rail. Note that the driver lacks a corresponding transistor coupling the distal end of the command bus 410 to the supply rail, hence the termination by Rterm is single-ended.

Figure 5:
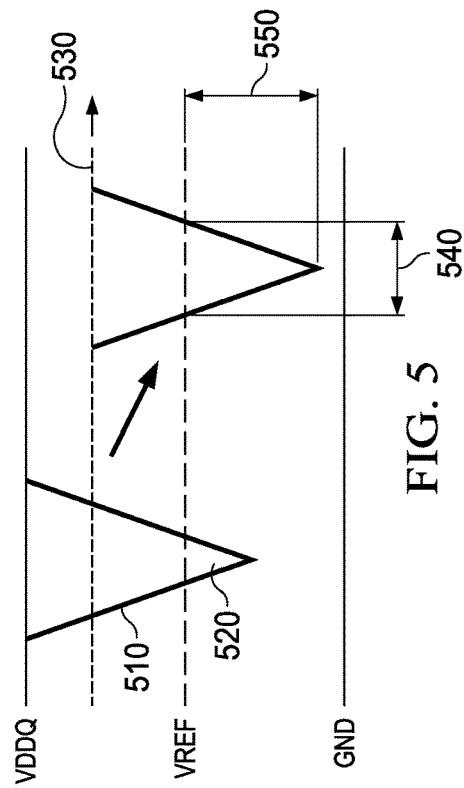
FIG. 5 is a diagram depicting asymmetric offset shifting occurring in the driver of FIG. 4.

FIG. 5 is a diagram depicting asymmetric offset shifting occurring in the driver of FIG. 4. The curve 510 represents a low (1-0-1) transition that begins and ends at the rail voltage Vddq—the voltage level that defines a logic one, and briefly dips below Vref—the voltage that differentiates a logic one from a logic zero. It will be noted that the extent to which, and the time over which, the curve 510 dwells below Vref is relatively small, as a region 520 indicates. It is desired to increase the extent and dwell time.

Accordingly, through judicious component selection of Rpu and Rterm, Vddq may be offset to new level 530 that lies below Vddq. A 1-0-1 transition 540 that begins and ends at the new level 530 dips farther below Vref and for a longer time, as the region 550 indicates. The region 550 is larger than the region 520 both in terms of depth and width.

Figure 6A:
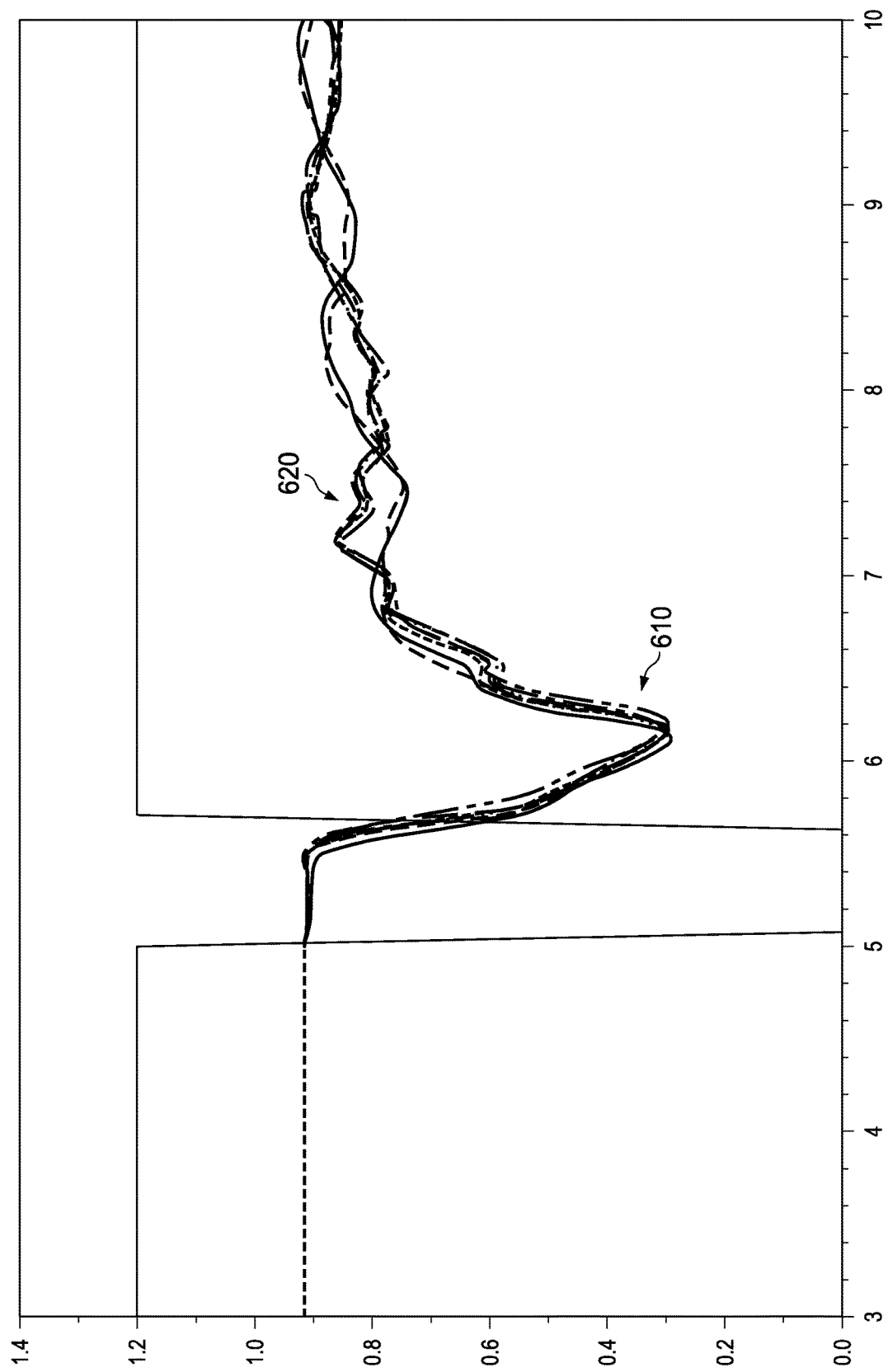
Figure 6B:
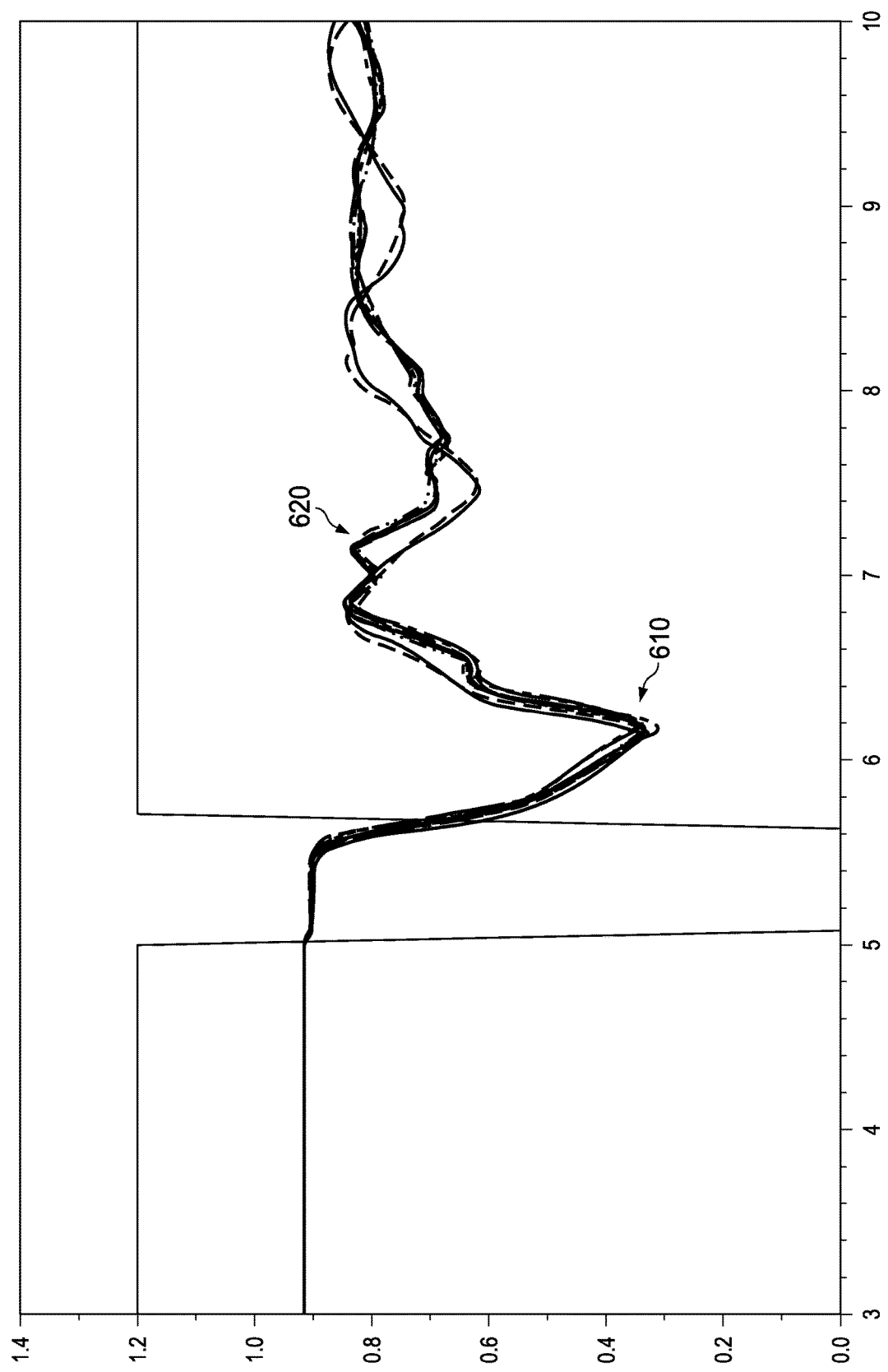
Figure 6C:
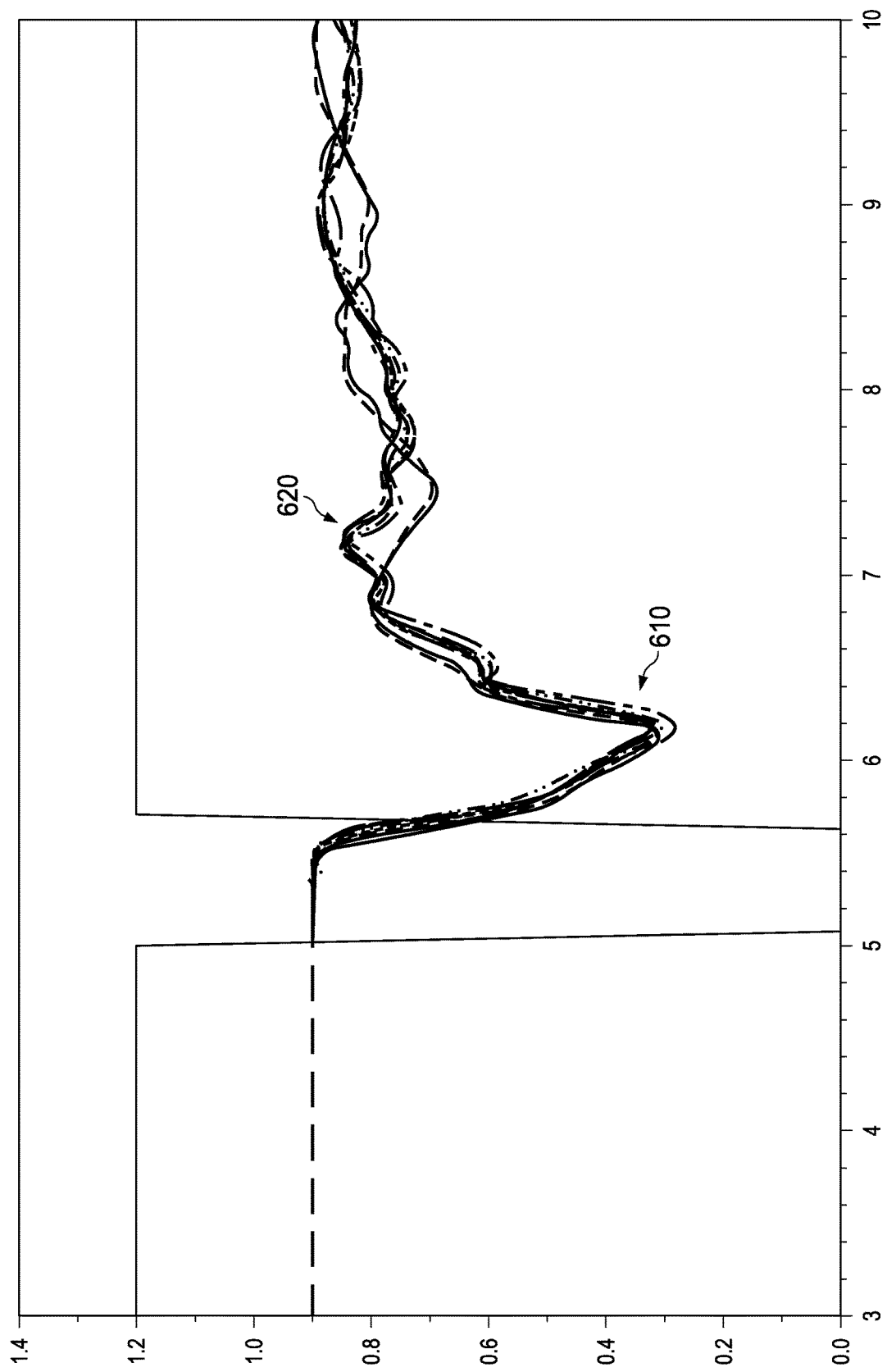
Figure 6D:
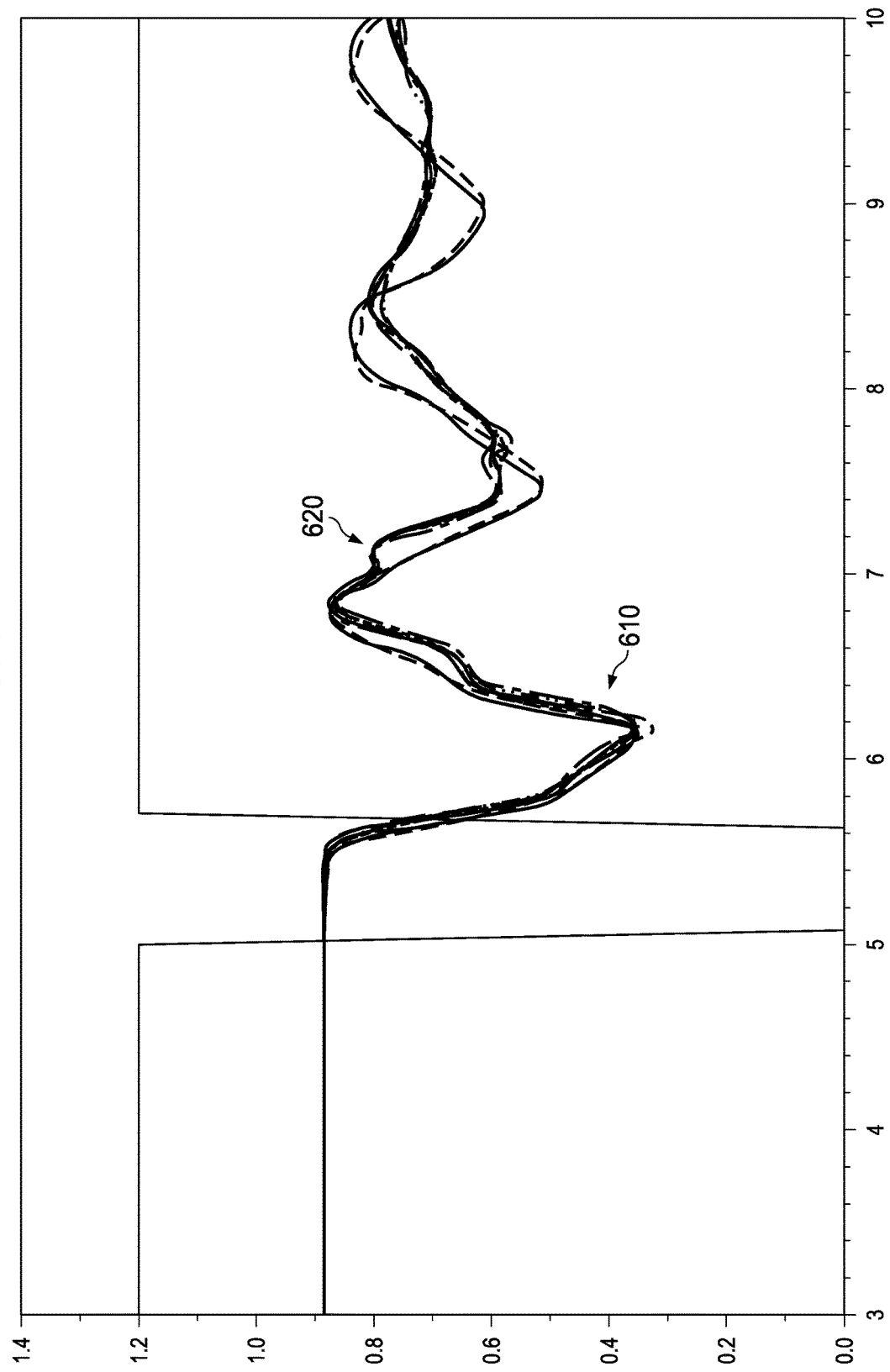

FIGS. 6A-6D graphically illustrate low transitions and concomitant ringing for four example combinations of drive and terminating resistances. The optimum combination is not only one that preserves low (1-0-1) transitions but also dissipates less power, and ideally minimal power. FIG. 6A shows a low transition 610 and ringing 620 for Rpu=80Ω and Rterm=250Ω. Power dissipation is about 4.4 mW. Ringing 620 is negligible. FIG. 6B shows a low transition and ringing for Rpu=100Ω and Rterm=300Ω. Power dissipation is about 3.6 mW. Ringing 620 is minor. FIG. 6C shows a low transition and ringing for Rpu=160Ω and Rterm=500Ω. Power dissipation is about 2.2 mW. Ringing 620 is more pronounced. FIG. 6D shows a low transition and ringing for Rpu=350Ω and Rterm=1000Ω. Power dissipation is about 1.1 mW. Ringing 620 is significant. It can be seen that, while power dissipation decreases with each example, ringing 620 increases. Ringing 620 in FIG. 6D is such that it dips below 0.6V, which would typically be Vref. Thus, the combination represented in FIG. 6C may be optimal for some applications, since it exhibits the lowest power dissipation without excessive ringing.

FIG. 7 is a high-level schematic of another embodiment of a DDR RAM driver. Unlike FIG. 4, FIG. 7 shows drive inverters 710, 720 for the pull-up and pull-down transistors 420, 430, respectively. The drive inverters 710, 720 accept differential drive signals DQ_P and DQ_N, respectively. A further pull-up transistor 740 having a resistance of Rpu_Gear_down is introduced, and the resistance of the pull-up transistor 420 is renamed Rpu_entry in FIG. 7 for clarity. A NAND gate 730 is also introduced and operable to accept DQ_P and a Gear down signal. Together, the NAND gate 730 and the further pull-up transistor 740 constitute one embodiment of gear down offset circuitry, operable to increase the extent and duration of 1-0-1 transitions on the command bus 410 by adjusting offset.

Accordingly, DQ_P and DQ_N are asserted and deasserted over time during both 1N and 2N timing modes, causing Rpu and Rpd to interact with Rterm to pull the command bus 410 to logic one or logic zero. Rpu and Rpd are selected such that CS# is not biased toward either logic one or logic zero. However, during transitions from the 1N timing mode to the 2N timing mode, the Gear down signal is also asserted, which places the further pull-up transistor 740 in parallel with the pull-up transistor 420. The resulting parallel resistances Rpu_entry and Rpu_Gear_down weaken any pull-up and offset Vddq such that the command bus 410 is biased toward zero, increasing the extent and duration of 1-0-1 transitions as desired. Once the 2N timing mode is entered, the Gear down signal is deasserted, returning the driver to an unbiased state for the remainder of the 1N timing mode. In one embodiment, Rpu_entry=160Ω, Rpu_Gear_down=400Ω (Rpu_entry and Rpu_Gear_down in parallel=~114Ω), Rpd=320Ω and Rterm=500Ω.

FIGS. 8A and 8B graphically illustrate margins 810 and data eyes 820 for the CS# bus driven by a conventional driver and a driver constructed according to the teachings herein. It can be seen that the margins 810 are similar. However, the power dissipation suffered by a conventional driver of FIG. 8A is 10.3 mW, while the power dissipation in FIG. 8B is only 2.7 mW.

FIG. 9 is a block diagram of one embodiment of a memory controller 910 constructed according to the teachings herein, together with a receiver portion of memory 920. A clock source 912 provides a clock signal to a clock tree 914. The clock tree 914 provides the clock signal to 0° and 90° phase shifters 916, 918. The output of the 90° phase shifter is employed as the clock input of a latch 920, which provides differential clock signals to a clock transmission logic path 922. Ultimately, a clock driver 924 in the memory controller 910 provides the differential clock signals via differential clock buses 926, 928 to a clock receiver 930 in the memory 920. The output of the receiver 930 is provided to a clock tree 932 and then the clock input of a latch 934.

A command core 936 provides memory control commands to a latch 938. The output of the 0° phase shifter 916 is employed as the clock input of the latch 936. The memory control commands present at the output of the latch 936 are provided to a command transmission logic path 940. Ultimately, a command driver 944 in the memory controller 910 provides the memory control signals via the command bus 410 to a command receiver 946 in the memory 920. The output of the receiver 946 is provided to a command receive logic path 948 and ultimately to the latch 934 and DDR RAM memory banks (not shown) of the memory 920.

In one embodiment, reflections and concomitant ringing in the command bus 410 may be mitigated by employing a Schmitt trigger as the command receiver 946. As those skilled in the art are aware, Schmitt triggers have hysteresis, which tends to cause noise, e.g., ringing, in a signal to be ignored. By setting Vm+ and Vm− in the Schmitt trigger appropriately, the ringing may be rendered of no effect.

FIG. 10 is a flow diagram of one embodiment of a method of transitioning from the 1N timing mode to the 2N timing mode carried out according to the teachings herein. The method begins in a start step 1010. In a step 1020, command signals are asserted or deasserted to pull-up and pull-down transistors coupled to the command bus during both 1N and 2N timing modes. As a result the command bus is pulled to a logic one or a logic zero. In a step 1030, a Gear down signal is asserted to offset the command bus when transitioning out of the 1N timing mode and into the 2N timing mode. In one embodiment, the Gear down signal is provided to a NAND gate having an output coupled to drive a further pull-up transistor synchronously with the pull-up transistor. In a step 1040, the Gear down signal is deasserted following the transitioning. In one embodiment, commands on the command bus are received with a Schmitt trigger. The method ends in an end step 1050.

Those skilled in the art to which this application relates will appreciate that other and further additions, deletions, substitutions and modifications may be made to the described embodiments.

What is claimed is:

1. A memory driver, comprising:
   pull-up and pull-down transistors couplable to a command bus of a memory controller and operable in 1N and 2N timing modes; and
   gear down offset circuitry coupled to said pull-up transistor and operable to offset said command bus when transitioning out of said 1N timing mode and increase an extent and duration of 1-0-1 transitions on said command bus.

2. The memory driver as recited in claim 1 wherein said gear down offset circuitry includes:
   a further pull-up transistor coupled to said pull-up transistor; and
   a NAND gate operable to receive a Gear down signal and having an output coupled to drive said further pull-up transistor synchronously with said pull-up transistor.

3. The memory driver as recited in claim 2 wherein said further pull-up transistor is coupled in parallel with said pull-up transistor.

4. The memory driver as recited in claim 2 wherein a terminating resistor provides a single-ended termination to a ground rail for said command bus.

5. The memory driver as recited in claim 4 wherein said pull-up transistor has a resistance of about 160 ohms, said pull-down transistor has a resistance of about 320 ohms, said further pull-up transistor has a resistance of about 400 ohms and said terminating resistor has a resistance of about 500 ohms.

6. The memory driver as recited in claim 2 wherein said pull-up and pull-down transistors and said further pull-up transistor are metal-oxide semiconductor field-effect transistors.

7. The memory driver as recited in claim 1 further comprising a Schmitt trigger coupled to said command bus as a receiver.

8. A method of driving a command bus for a synchronous dual data rate memory, comprising:
   asserting and deasserting command signals to pull-up and pull-down transistors coupled to said command bus during both 1N and 2N timing modes, said command bus being pulled to a logic one or a logic zero;
   asserting a Gear down signal to offset said command bus when transitioning out of said 1N timing mode and into said 2N timing mode; and
   deasserting said Gear down signal following said transitioning.

9. The method as recited in claim 8 wherein said asserting said Gear down signal comprises providing said Gear down signal to a NAND gate having an output coupled to drive a further pull-up transistor synchronously with said pull-up transistor.

10. The method as recited in claim 9 wherein said further pull-up transistor is coupled in parallel with said pull-up transistor.

11. The method as recited in claim 9 wherein a terminating resistor provides a single-ended termination to a ground rail for said command bus.

12. The method as recited in claim 11 wherein said pull-up transistor has a resistance of about 160 ohms, said pull-down transistor has a resistance of about 320 ohms, said further pull-up transistor has a resistance of about 400 ohms and said terminating resistor has a resistance of about 500 ohms.

13. The method as recited in claim 9 wherein said pull-up and pull-down transistors and said further pull-up transistor are metal-oxide semiconductor field-effect transistors.

14. The method as recited in claim 8 further comprising receiving commands on said command bus with a Schmitt trigger.

15. A memory controller for controlling dynamic random-access memory in 1N and 2N timing modes, comprising:
   a command core;
   a command transmitter logic path coupled to said command core; and
   a command driver, including:
      pull-up and pull-down transistors couplable to a command bus of a memory controller and operable in said 1N and 2N timing modes,
      a terminating resistor coupled to said command bus and operable to provide a single-ended termination to a ground rail for said command bus, and
      a further pull-up transistor coupled to said pull-up transistor; and
      a NAND gate operable to receive a Gear down signal and having an output coupled to drive said further pull-up transistor synchronously with said pull-up transistor.

16. The memory controller as recited in claim 15 wherein said further pull-up transistor is coupled in parallel with said pull-up transistor.

17. The memory controller as recited in claim 15 wherein said pull-up transistor has a resistance of about 160 ohms, said pull-down transistor has a resistance of about 320 ohms, said further pull-up transistor has a resistance of about 400 ohms and said terminating resistor has a resistance of about 500 ohms.

18. The memory controller as recited in claim 15 wherein said pull-up and pull-down transistors and said further pull-up transistor are metal-oxide semiconductor field-effect transistors.

19. The memory controller as recited in claim 15 further comprising a Schmitt trigger coupled to said command bus as a receiver.

20. The memory controller as recited in claim 15 wherein said memory is sDDR4 memory.

* * * * *